METHOD OF FORMING AN INSULATED GROUND PLANE FOR A CRYOGENIC DEVICE

Filed Dec. 30, 1965

Inventors:
Constantine A. Neugebauer,
John R. Rairden, III,
Reuben E. Joynson, Jr.
by Paul R. Webb, II
Their Attorney.

United States Patent Office 3,436,258
Patented Apr. 1, 1969

3,436,258
METHOD OF FORMING AN INSULATED GROUND PLANE FOR A CRYOGENIC DEVICE

Constantine A. Neugebauer, Schenectady, John R. Rairden III, Albany, and Reuben E. Joynson, Jr., Schenectady, N.Y., assignors to General Electric Company, a corporation of New York Filed Dec. 30, 1965, Ser. No. 517,608
Int. Cl. B44d *1/18, 1/34*
U.S. Cl. 117—217 3 Claims

ABSTRACT OF THE DISCLOSURE

Insulated ground planes for cryogenic devices are formed by depositing a superconductive film of niobium or tantalum in a thickness between 400 A. and 5,000 A. upon a glass or metallic substrate and subsequently anodizing the film, as deposited, in an oxidizing electrolyte to form an oxide insulating layer in a thickness greater than 30 A. The oxide insulating layer also can be formed on the superconductive film by heating the film in air at a temperature below 300° C.

This invention relates to methods of forming composite articles, and more particularly to method of forming composite articles with a substrate, a superconductive metallic film on the substrate, and a metallic oxide insulator film on the metallic film.

A composite article of the above type is desirable as an insulated ground plane for a cryogenic device. Cryotron circuits are deposited on the surface of the insulation. However, such insulated ground planes require a suitable smooth substrate, a smooth, high purity superconductive metallic film which adheres to the substrate, and a pinhole free insulating layer on the film. Additionally, it is necessary that the superconductive metallic film be formed over a large surface, and that insulating layer cover and adhere to the film without containing pin-holes or other flaws. The insulating layer must not develop such pinholes or flaws when subjected to repeated temperature cycling.

The present application is directed to an improved method of forming a composite article which solves the above problems whereby it is particularly suitable as an insulated ground plane.

In copending application filed Sept. 23, 1963, as Ser. No. 311,935 now Patent No. 3,328,200, there is described and claimed a method of forming superconductive metallic films which application is assigned to the same assigneee as the present application. The superconductive metallic films produced in accordance with this copending patent application are very suitable for employment in our composite article and its manufacture.

It is an object of our invention to provide a method of forming a composite article having a metallic substrate characterized by smoothness, an unpolished, high purity superconductive metallic film adhering firmly to substrate, and a metal oxide insulator film adhering firmly to the superconductive film.

In carrying out our invention in one form, a composite article is formed which comprises a substrate characterized by smoothness, an unpolished, high purity superconductive metallic film adhering firmly to the substrate, and a metal oxide insulator film adhering firmly to the superconductive film.

These and various other objects, features and advantages of the invention will be better understood from the following description taken in connection with the accompanying drawings in which.

Figure 1:
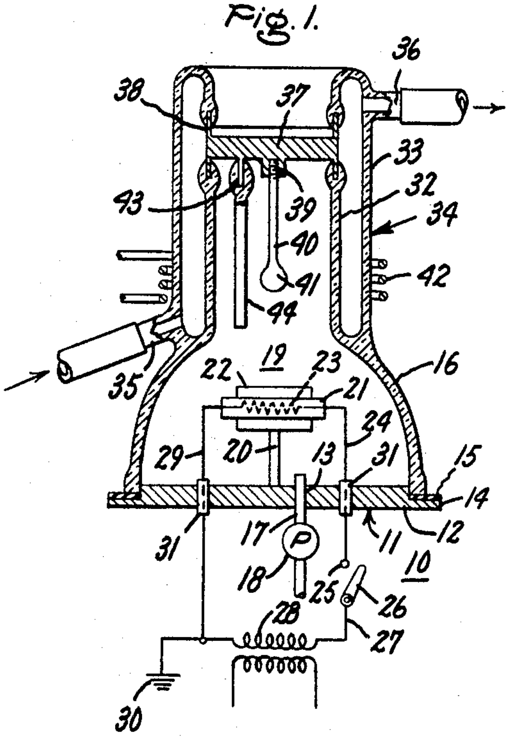
FIGURE 1 is a sectional view of apparatus in the formation of composite articles in accordance with our invention.

In FIGURE 1 of the drawing, apparatus is shown generally at 10 for forming composite articles embodying our invention. A metal base 11 has a raised center portion 12 with an aperture 13 therein and an outer rim 14 on which is positioned a rubber gasket 15. A glass bell jar 16 is positioned on gasket 15 adjacent the edge of center portion 12 of base 11. An evacuation line 17 is positioned in aperture 13 and is regulated by a pump 18 to evacuate a chamber 19 defined by bell jar 17 and center portion 12 of base 11.

A pedestal 20 is mounted on the upper surface of the center portion 12 of metal base 11. A heater 21 is supported on pedestal 20 to provide heat for a glass substrate 22 shown positioned on the upper surface of heater 21. Heater 21 is shown as a member of quartz, mica or Vycor, which has a heating element 23 in the form of a filament extending therethrough. A lead 24, which is connected to one end of filament 23, has a terminal 25 which is adapted to be contacted by a switch 26. A lead 27 is connected from a variable transformer 28 to switch 26. A second lead 29, which is connected to the opposite end of filament 23, is connected to variable transformer 28 and grounded at 30. Transformer 28, which is connected to a 115 volt, AC current supply, provides a 0–40 volt, 0–5 ampere range power source to heat filament 35 in heater 33. Leads 24 and 29 extend through center portion 12 of metal base 11 by means of electrically insulating sleeves 31.

The upper portion of bell jar 16 with a diameter less than its lower portion has an inner wall 32 and an outer wall 33 forming a condenser 34. Water is supplied to condenser 34 through water inlet 35 and discharged from water outlet 36. A metal support bracket 37 has a rim 38 at its periphery which is bonded by any suitable means to inner wall 32 of condenser 34. Bracket 37 has a threaded portion 39 which positions the threaded end of a rod 40 of a high melting point superconductive metal, such as niobium. At the free end of rod 40 there is shown a globule 41 of niobium which is formed during a previous melting of the tip of rod 40. An induction coil 42 surrounds a portion of the exterior wall of condenser 34 adjacent to tip of rod 40. A projection 43 from bracket 37 carries a glass rod 44 which is at least the length of rod 115.

Induction coil 42 is provided to heat and melt at least a part of the superconductive metal in rod 40. For simplification, a pivotal shield, with its associated equipment, which is shown in FIGURE 1 of copending application Ser. No. 311,935, now Patent No. 3,328,200 is not shown in this drawing but is employable herein.

Figure 2:
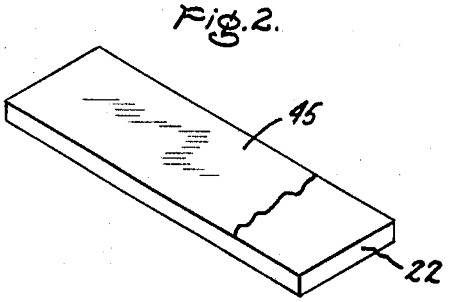
FIGURE 2 is a perspective view of a substrate coated in the apparatus of FIGURE 1.

In FIGURE 2 of the drawing, there is shown a substrate 22 of glass as is disclosed in FIGURE 1 of the drawing. An unpolished high purity superconductive niobium film 45 is shown adhering to one surface of substrate 22. Niobium film 45 is evaporated on substrate 22 in apparatus 10 of FIGURE 1.

Figure 3:
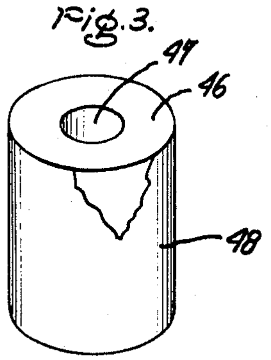
FIGURE 3 is a perspective view of another substrate coated in the apparatus of FIGURE 1.

In FIGURE 3 of the drawing, there is shown a cylindrical copper substrate 46 having a central aperture 47 therethrough, and an unpolished, high purity superconductive niobium film 48 adhering to the exterior surface of substrate 46. Niobium film 48 is evaporated on cylindrical substrate 46 in apparatus 10 of FIGURE 1. During the evaporation, cylindrical substrate 46 is rotated on its axis.

Figure 4:
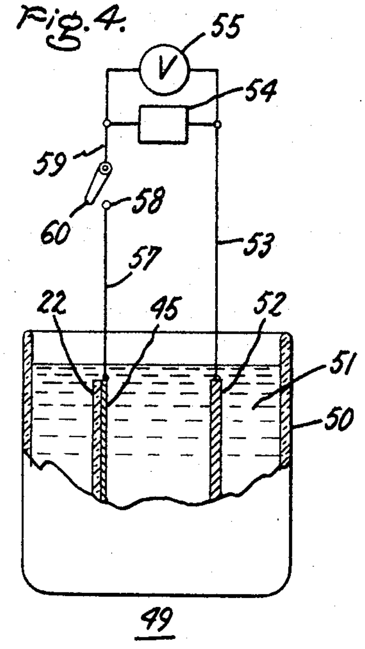
FIGURE 4 is a partial sectional view of additional apparatus employed in the formation of composite articles in accordance with our invention.

In FIGURE 4 of the drawing, there is shown additional apparatus 49 for forming composite articles in accordance with our invention. Apparatus 49 comprises an electrically insulated electrolytic tank 50 which contains an electrically conducting and oxidizing electrolyte liquid 51, such as dilute phosphoric acid, dilute nitric acid, dilute sulphuric acid or ammonium pentaborate in ethylene glycol and water. A platinum cathode 52, which is inert to the electrolyte, is shown positioned in electrolyte 51. Cathode 52 is connected by a lead 53 to a variable voltage supply 54, preferably a direct current source. A voltmeter 55 is connected across the terminals of voltage supply 54. An anode is positioned in electrolyte 51 and connected by a lead 57 to a terminal 58. A lead 59 from battery 54 is connected to a switch 60 which is adapted to contact terminal 58. The anode consists of unpolished high purity superconductive film 45 shown in FIGURE 2 which film adheres firmly to glass substrate 22. Heating means (not shown) are provided if it is desired to heat electrolytes 51 to an appropriate temperature.

Figure 5:
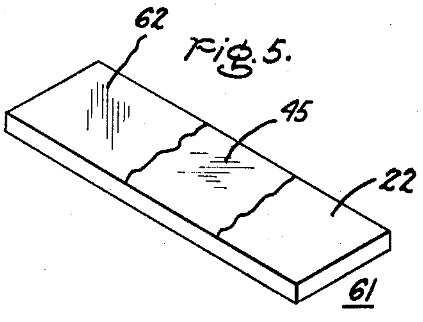
FIGURE 5 is a perspective view of a composite article formed by the method of our invention.

In FIGURE 5 of the drawing, there is shown a composite article formed by the method of our invention which comprises a glass substrate 22, an unpolished high purity superconductive niobium film 45 adhering firmly to substrate 22, and a niobium oxide insulator film 62 adhering firmly to niobium film 45. Insulator film 62 is formed on niobium film 45 by anodizing the niobium film in the electrolytic bath apparatus which is shown in FIGURE 4.

We discovered that a composite article could be formed which comprised a substrate characterized by smoothness, an unpolished, high purity superconductive metallic film adhering firmly to the substrate, and a metal oxide insulator film adhering firmly to the superconductive film. We found that such a composite article provided a very suitable insulated ground plane with a large surface area. The metal oxide insulator film adheres firmly to the metallic film. Additionally, the insulator film contains no pin-holes or flaws even when subjected to repeated temperature cycling.

We found that a substrate characterized by smoothness is provided from a number of both metallic and non-metallic materials. Metallic materials for such substrate use include copper, aluminum, niobium, tungsten, molybdenum, tantalum, and zirconium. In order to provide the substrate with a smooth surface for the subsequent deposition of a superconductive film thereon, the metallic substrate is mechanically or chemically polished. The above materials are particularly desirable for employment as a substrate in the composite article formed by the method of our invention in that they provide a suitable material, can be polished to a smooth finish, mechanically or chemically, and result in a smooth, non-ferromagnetic material with higher heat conductivity at cryogenic temperatures than glass.

While various non-metallic refractory materials such as fused silica, mica or Vycor are suitable materials for a substrate in the composite article of our invention, we found that the most desirable material in the non-metallic refractories is glass including particularly sodalime glass. Glasses require generally no polishing to exhibit the characteristic to smoothness required for the substrate. In the event that further smoothness is desirable, glasses can be easily mechanically polished to exhibit this characteristic.

We found that an unpolished, high purity superconductive metallic film adhering to the substrate was necessary in the formation of our composite article. Suitable superconductive metals and alloys for such a film include niobium, tantalum, vanadium, niobium-tin, and niobium-zirconium. Such a film is desired in unpolished form to provide a continuous smooth surface for the evaporated film. Niobium, tantalum, and vanadium are soft materials which scratch easily and are difficult to polish mechanically to a smooth surface. Chemical polishing of these materials has not proved feasible to date. In addition to the difficulty of polishing these materials in film form, the magnitude of the difficulty increases as the size of the film surface increases. This is true for the mechanical polishing of any metallic surface.

We found also that the superconductive metallic film must exhibit high purity to provide superconductivity when subsequently subjected to a temperature below its critical temperature, $T_c$. A high purity superconductive metallic film is a film which has a low oxygen content, absence of precipitated impurities, and absence of cracks due to impurities. We found that high purity superconductive metallic films which adhere to a substrate are formed by employing the method described in the above mentioned copending application, Ser. No. 311,935 now Patent No. 3,328,200. The superconductive metallic films produced in accordance with that method exhibit high purity, do not require polishing, and adhere firmly to the substrate. We found further that we are able to provide such superconductive metallic films with these desirable characteristics in thickness greater than 400 A. over a wide surface area.

We found that a metal oxide insulator film which adheres firmly to the superconductive metallic film is provided by a metal oxide in which the metallic component is the same as the superconductive metallic film. Our oxide insulator films have a thickness of at least 30 angstroms, cover a large surface area, and are free of pin-holes and flaws. These insulator films are smooth without any unexposed portion of metallic film.

We discovered also that composite articles of the above types are formed by providing a substrate characterized by smoothness, evaporating a smooth, high purity superconductive metallic film on said substrate, and forming an adhering metal oxide insulator film on said metallic film, the metallic component of said metal oxide being the same metal as the superconductive metallic film. We found that we form the oxide insulator film by anodizing the superconductive metallic film or by thermally oxidizing such metallic film in an air atmosphere at a temperature not above 300° C.

In the operation of the apparatus shown in FIGURE 1 of the drawing, a glass substrate 22 is positioned on the upper surface of heater 21 which has heating filament 23 imbedded therein. A niobium rod 40 is threaded in support bracket 37 and glass rod 44 is carried by this bracket. Bell jar 16 is positioned on rubber gasket 15 and its inner edge is adjacent to center portion 12 of base member 12. The tip of rod 40 is positioned within and surrounded by induction coil 42 which is located around the exterior wall of condenser 34. Water is flowed through the condenser during operation to cool bell jar 16.

Pump 18 evacuates chamber 19 through exit line 17 to a pressure in the range of $1\times10^{-9}$ to $5\times10^{-5}$ millimeters of mercury. Substrate 22 is positioned approximately one inch from the end of rod 40. Induction coil 42 is energized from a variable power source (not shown) to heat and melt at least a part of the superconductive metal in rod 40 as shown, for example, by globule 41. A portion of niobium metal from globule 41 of rod 40 is evaporated on the interior surface of chamber 19 and on substrate 22. The initial portion of the evaporated metal getters oxygen and oxygen containing compounds within chamber 19. Glass rod 44 casts a shadow on the interior of inner wall 32 of condenser 34 to prevent a continuous annular deposit of metal on wall 32. In this manner, effective heating and melting of a portion of rod 40 is accomplished. The subsequent evaporation of an additional portion of niobium metal and its condensation on the substrate forms an unpolished, high purity film which exhibits superconductivity. Substrate 22 is maintained at a temperature of approximately 300° C. by the heat from globule 41 at the tip of rod 40. This substrate must be heated to a temperature in excess of 25° C., to have the condensed film exhibit subsequent superconductivity below its critical temperature.

In order to produce the superconducting film on the above substrate, it is necessary to heat the metallic or the non-metallic refractory substrate to a temperature in excess of 25° C. Normally the heat generated by the molten portion of the superconductive metal heats the substrate to a temperature in excess of 25° C. and generally to a temperature of several hundred degrees centigrade. If the substrate is not heated to a temperature in excess of 25° C., the film which is formed on the substrate will not exhibit superconductivity when lowered below its critical temperature.

In the above method of forming a superconductive film on a substrate, as the rapid deposition rate is increased, a lower substrate temperature is tolerable in the process. The rate of deposition is defined as the number of metal atoms which impinge upon a square centimeter of substrate in a second. Since at least a part of the superconductive metal is heated to at least its melting point, the deposition rate can be increased by increasing the amount of molten metal. Also, this rapid deposition rate can be varied by moving the substrate closer to or farther away from the molten portion of the substrate metal. However, it is necessary to employ a substrate temperature in excess of 25° C. to produce superconductivity in the deposited film when lowered below its critical temperature. If the substrate is sufficiently far away from the molten portion of the superconductive metal, it is then necessary to employ auxiliary heating of the substrate to have the substrate temperature in excess of 25° C. Normally, such auxiliary heating is unnecessary since the heat radiated from the molten portion of the superconductive metal will maintain the substrate at a temperature in excess of 25° C. The heating of the substrate to a temperature in excess of 25° C. is required for both the metallic and the non-metallic refractory substrates.

If it is necessary to provide auxiliary heating to have substrate 22 at a temperature in excess of 25° C., switch 26 is closed by contacting terminal 25 thereby providing a current through leads 24 and 29 to heat coil 23. After evaporation to the desired thickness is completed, switch 26 is opened.

The induction heating is terminated and chamber 19 is allowed to cool to room temperature. After the chamber is returned to atmospheric pressure, bell jar 16 is removed therefrom. Substrate 22 with its unpolished, high purity niobium film thereon is then removed from chamber 19. If it is desired, a shield which is shown in FIGURE 1 of copending application Ser. No. 311,935 now Patent No. 3,328,200 can be employed in apparatus 10 during the formation of the superconductive niobium film.

In FIGURE 2 of the drawing, a glass substrate 22 is shown with an unpolished, high purity superconductive niobium film 45 adhering firmly thereto. The niobium film 45 is evaporated on substrate 22 in apparatus 10 of FIGURE 1.

In FIGURE 3 of the drawing, a cylindrical copper substrate 46 with a central aperture 47 has an unpolished, high purity superconductive film adhering to its exterior surface. The niobium film is evaporated on substrate 46 in apparatus 10 in FIGURE 1.

In the operation of apparatus 49 in FIGURE 4, electrically insulated tank 50 is filled with an electrolyte 51 which is electrically conducting and oxidizing. Suitable electrolytes, which will not react with the oxide to be formed, include dilute phosphoric acid, dilute nitric acid, and dilute sulphuric acid. A platinum cathode, which is inert to the electrolyte, is immersed therein and connected by a lead 53 to variable voltage supply 54 which has a voltmeter 55 across its terminals. The anode, which is immersed in the electrolyte, consists of an unpolished, high purity superconductive niobium film 45 on its substrate 22. A lead 57 connects niobium film 45 to a terminal 58 which is adapted to be contacted by switch 60. A lead 59 connects switch 60 to power source 54.

The thickness of the metal oxide insulator film which is formed on superconductive metallic film 45 is directly proportional to the voltage applied in the electrolytic process. We found generally that we applied an insulator film of 20 A. thickness for each volt over a wide range of current which extended for example to 10 milliamperes per square centimeter. A particular voltage is applied to closed switch 60. After the adhering metal oxide film forms on film 45, switch 60 is opened. The anode structure is removed, rinsed with water and allowed to dry. Such structure produces composite article 61 embodying our invention which is shown in FIGURE 5. Film 62 is a metal oxide whose metallic component is the same metal as the metal of film 45.

Metal oxide insulator film 62 is also formed on metallic film 45 which adheres to substrate 22 as shown in FIGURE 5 by thermal oxidation. Substrate 22 with metallic film 45 thereon as shown in FIGURE 2 is subjected to heating from any suitable source (not shown). This heating is accomplished in an air or oxygen atmosphere at a temperature not higher than 300° C. for a sufficient period of time to form an adherent metal oxide insulator film 62 on metallic film 45. After the insulator film 62 is formed on metallic film 45, our composite article 61 is produced. Similarly, insulator film 62 is formed on metallic film 48 shown in FIGURE 3 of the drawing.

Several examples of composite articles which are made in accordance with the present invention are as follows:

The substrate must be heated to a temperature in excess of 25° C. whereby the resulting film will exhibit superconductivity when lowered below its critical temperature. The substrate temperature in excess of 25° C. which is necessary for the subsequent superconductivity of the deposited film will vary above 25° C. depending upon the vacuum employed and the rate of deposition. Since one of the variables of the rate of deposition is normally maintained constant by heating the same portion of the superconductive metal to at least its melting point, the rate can be varied by moving the substrate closer to or farther away from the molten end of the superconductive rod. When a distance of one inch between the molten end of the superconductive rod and the substrate is employed, a temperature of several hundred degrees centigrade is maintained in the substrate. Thus, the subsequent film will be superconducting when lowered below its critical temperature. While the temperature of the substrate may be varied depending upon its distance from the molten end of the superconductive rod, the temperature of the substrate must be above 25° C. The lowest possible temperature must be above 25° C. for the specific superconductive material to be evaporated which can be easily ascertained by mere routine experimentation. Thus, it was not believed necessary to determine each of these minimum temperature requirements for each of the superconductive materials with a number of varying distances between the end of the molten rod and the substrate employed.

Example I

Apparatus is set up in accordance with FIGURE 1 of the drawing. A copper substrate is positioned on the heater. A niobium rod containing 99.9 weight percent niobium is employed as the metallic member from which niobium is evaporated onto the substrate. The bell jar is placed on the rubber gasket positioned on the rim of the base member. The chamber within the bell jar is evacuated by the pump to the pressure in the range of $1\times10^{-9}$ to $5\times10^{-5}$ millimeters of mercury. The substrate is positioned approximately one inch from the end of the niobium rod. The induction coil is energized from a variable power source to heat and melt at least a part of the superconductive metal in the rod. The rapid evaporation is continued for a period of forty minutes. The substrate is maintained at a temperature of approximately 300° C. from heat provided by the molten end of the niobium rod. At the end of this time, the power supply is discontinued and the apparatus is allowed to cool to room temperature. The chamber was then returned to atmospheric pressure. The bell jar is removed from the rubber gasket to provide access to the copper substrate therein. The substrate has a film of smooth, high purity niobium adhering thereto which is one micron in thickness.

Apparatus is then set up in accordance with FIGURE 4 of the drawing. The niobium film is employed as the anode while a platinum member is used as the cathode. Electroplater's tape is applied to and covers the copper substrate. A dilute solution of phosphoric acid provides the electrolyte for the tank. The voltage of the power source is adjusted to 25 volts and the switch is closed. The anodization provides a layer of niobium oxide insulator film of a thickness of 500 A. on the niobium film within one minute. The switch is opened. The anode structure is removed, rinsed with water, and allowed to dry. This structure provides a composite article formed by the method of our invention.

Example II

Apparatus is set up in accordance with FIGURE 1 of the drawing. A glass substrate is positioned on the heater. A niobium rod having a diameter of ⅛ inch is employed as the metallic member from which niobium is evaporated on the substrate. The bell jar is placed on the rubber gasket positioned on the rim of the base member. The chamber within the bell jar is evacuated by the pump to the pressure in the range of $1\times10^{-9}$ to $5\times10^{-5}$ millimeters of mercury. The substrate is positioned approximately one inch from the end of the niobium rod. The induction coil is energized from a variable power source to heat and melt at least a part of the superconductive metal in the rod. The rapid evaporation is continued for a period of approximately twenty minutes. The substrate is maintained at a temperature of approximately 300° C. from heat provided by the molten end of the niobium rod. At the end of this time, the power supply is discontinued and the apparatus is allowed to cool to room temperature. The chamber is then returned to atmospheric pressure. The bell jar is removed from the rubber gasket to provide access to the glass substrates therein. The substrate has a film of niobium which is 5000 angstroms in thickness.

An apparatus is set up in accordance with FIGURE 4 of the drawing. The niobium film is employed as an anode while a platinum member is used as a cathode. A dilute solution of sulphuric acid within the tank provides the electrolyte. The voltage of the power source is adjusted to 75 volts and the switch is closed. The anodization provides a layer of niobium oxide insulator film of a thickness of 1500 angstroms on the niobium film within one minute. The switch is opened. The anode structure is removed, rinsed with water, and allowed to dry. This structure provides a composite article formed by the method of our invention.

Example III

Apparatus is set up in accordance with FIGURE 1 of the drawing. A quartz substrate is positioned on the heater. A tantalum rod having a diameter of ⅛ inch is employed as the metallic member from which tantalum is evaporated on the substrate. The bell jar is placed on the rubber gasket positioned on the rim of the base member. The chamber within the bell jar is evacuated by the pump to the pressure in the range of $1\times10^{-9}$ to $5\times10^{-5}$ millimeters of mercury. The substrate is positioned approximately one inch from the end of the tantalum rod. The induction coil is energized from a variable power source to heat and melt at least a part of the superconductive metal in the rod. The rapid evaporation is continued for a period of ten minutes. The substrate is maintained at a temperature of approximately 300° C. from heat provided by the molten end of the tantalum rod. At the end of this time, the power supply is discontinued and the apparatus is allowed to cool to room temperature. The chamber is then returned to atmospheric pressure. The bell jar is removed from the rubber gasket to provide access to the quartz substrates therein. The substrate has a film of tantalum which is 5000 angstroms in thickness.

An apparatus is set up in accordance with FIGURE 4 of the drawing. The tantalum film is employed as an anode while a platinum member is used as a cathode. A dilute solution of phosphoric acid within the tank provides the electrolyte. The voltage of the power source is adjusted to 100 volts and the switch is closed. With tantalum, an insulator film of 15 angstroms thickness for each volt is applied. The anodization provides a layer of tantalum oxide insulator film of a thickness of 1500 angstroms on the tantalum film within one minute. The switch is opened. The anode structure is removed, rinsed with water, and allowed to dry. This structure provides a composite article formed by the method of our invention.

Example IV

Apparatus is set up in accordance with FIGURE 1 of the drawing. A plurality of aluminum substrates are positioned on the heater. A niobium rod having a diameter of ⅛ inch is employed as the metallic member from which niobium evaporated on the substrate. The bell jar is placed on the rubber gasket positioned on the rim of the base member. The chamber within the bell jar is evacuated by the pump to the pressure in the range of $1\times10^{-9}$ to $5\times10^{-5}$ millimeters of mercury. The substrate is positioned approximately one inch from the end of the niobium. The induction coil is energized from a variable power source to heat and melt at least a part of the superconductive metal in the rod. A molybdenum shield is positioned initially between the end of the rod and the substrate. The rapid evaporation is commenced. After ten minutes, the shield is removed. The rapid evaporation is continued for a total period of forty minutes. The substrate is maintained at a temperature of approximately 300° C. from heat provided by the molten end of the niobium rod. At the end of this time, the power supply is discontinued and the apparatus is allowed to cool to room temperature. The chamber is then returned to atmospheric pressure. The bell jar is removed from the rubber gasket to provide access to the aluminum substrate therein. This substrate has a film of niobium which is 5000 angstroms in thickness.

An apparatus is set up in accordance with FIGURE 4 of the drawing. The niobium film is employed as an anode while a platinum member is used as a cathode. A dilute solution of ammonium pentaborate in ethylene glycol within the tank, provides the electrolytes. The voltage of the power source is adjusted to 50 volts and the switch is closed. The anodization provides a layer of niobium oxide insulator film of a thickness of 1000 angstroms on the niobium film within one minute. The switch is opened. The anode structure is removed, rinsed with water, and allowed to dry. This structure provides a composite article formed by the method of our invention.

Example V

Apparatus is set up in accordance with FIGURE 1 of the drawing. A quartz substrate is positioned on the heater. A tantalum rod having a diameter of ⅛ inch is employed as the metallic member from which tantalum is evaporated on the substrate. The bell jar is placed on the rubber gasket positioned on the rim of the base member. The chamber within the bell jar is evacuated by the pump to the pressure in the range of $1\times10^{-9}$ to $5\times10^{-5}$ millimeters of mercury. The substrates are positioned approximately one inch from the end of the tantalum rod. The induction coil is energized from a variable power source to heat and melt at least a part of the superconductive metal in the rod. The rapid evaporation is continued for a period of twenty minutes. The substrate is maintained at a temperature of 600° C. from heat provided by the molten end of the tantalum rod and from the heater. At the end of this time the power supply is discontinued and the apparatus is allowed to cool to room temperature. The chamber is then returned to atmospheric pressure. The bell jar is removed from the rubber gasket to provide access to the quartz substrates therein. The substrate has a tightly adherent film of tantalum which is 3000 A. in thickness.

The above unpolished, high purity superconductive tantalum film, which adheres to its quartz substrate, is subjected to thermal oxidation. The tantalum film is heated in air at a temperature of 275° C. for one hour. A tantalum oxide insulator film is formed on and adheres firmly to the tantalum film. After this insulator film is formed on the metallic film, a composite article is produced in accordance with our invention.

While other modifications of the invention and variation of method which may be employed in the scope of the invention have not been described, the invention is intended to include such that may be embraced within the following claims.

What we claim as new and desire to secure by Letters Patent of the United States is:

1. A method of forming an insulated ground plane for a cryogenic device comprising positioning a smooth substrate and a source selected from the group consisting of niobium and tantalum in an evaporation chamber, heating said substrate to a temperature above 25° C., evacuating said chamber to a pressure in the range of $1\times10^{-9}$ to $5\times10^{-5}$ millimeters of mercury, evaporating said source and depositing a superconductive film to a thickness between 400 A. and 5,000 A., removing said deposited superconductive film from said evaporation chamber and immersing said film, as deposited, in an oxidizing electrolyte and anodizing said film in said electrolyte to form an oxide insulating layer upon said film in a thickness greater than 30 A.

2. A method of forming an insulated ground plane for a cryogenic device according to claim 1 wherein said substrate is a metal selected from the group consisting of copper, aluminum, niobium, tungsten, molybdenum, tantalum and zirconium and further including polishing said substrate prior to the deposition of the superconductive film thereon.

3. A method of forming an insulated ground plane for a cryogenic device comprising positioning a smooth substrate and a source selected from the group consisting of niobium and tantalum in an evaporation chamber, heating said substrate to a temperature above 25° C., evacuating said chamber to a pressure in the range of $1\times10^{-9}$ to $5\times10^{-5}$ millimeters of mercury, evaporating said source and depositing a superconductor film to a thickness between 400 A. and 5,000 A., releasing the vacuum in said chamber and heating said superconductor film at a temperature below 300° C. to form an oxide insulating layer upon said ground plane in a thickness greater than 30° A.

References Cited

UNITED STATES PATENTS

| | | | |
|---|---|---|---|
| 2,936,435 | 5/1960 | Buck. | |
| 3,047,424 | 7/1962 | Suchoff | 117—119.6 |
| 3,125,688 | 3/1964 | Rogers. | |
| 3,159,556 | 12/1964 | McLean et al. | 204—38.1 X |
| 3,205,413 | 9/1965 | Anderson | 117—217 X |
| 3,205,461 | 9/1965 | Anderson | 117—217 X |
| 3,214,249 | 10/1965 | Bean et al. | 29—195 X |
| 3,274,024 | 9/1966 | Hill et al. | |
| 3,328,200 | 6/1967 | Neugebauer | 117—107 X |
| 3,338,744 | 8/1967 | Clough et al. | 117—107 X |
| 3,365,378 | 1/1968 | Maissel et al. | 204—38.1 |
| 3,368,919 | 2/1968 | Casale et al. | 117—217 |

OTHER REFERENCES

Young L. Aniodic Oxide Films of Niobium. In Can. J. Chem. 38: pp. 1141–1142, 1960.

Lakhiani D. M. and Shreir L. L. Crystallization of Amorphous Niobium Oxide during Aniodic Oxidation, In Nature 188(4744) pp. 49–50 (1960).

Sherrill M. D., Edwards H. H. Superconducting Tunneling On Bulk Niobium In Physical Reivew Letters 6(9), pp. 400–461, May 1, 1961.

Kofstad, P.; Kjollesdal, H.; Markali, J.; and Norman, N. High Temperature Oxidation of Niobium, in Chemical Abstracts 57, 16296d, 1962.

Brauer, G.; Mueller, H.; Kuehner, 6. Oxides of Niobium and Tantalium Formed on Low Temperature Oxidation, in Chemical Abstracts 58, 7692d, 1963.

Seidel, T.; Wicklund, A. W.; Tunneling in Superconducting $Nb_3Sn$, in Chemical Abstracts 61, 14008g, 1964.

ALFRED L. LEAVITT, *Primary Examiner.*

C. K. WEIFFENBACH, *Assistant Examiner.*

U.S. Cl. X.R.

117—107, 227, 230; 29—599, 195, 197, 198, 194; 204—38, 56